METHOD OF ELECTRICALLY TESTING SEMICONDUCTOR ELEMENTS RETAINED UNDER A PRESSURE DRAWN FILM

Filed Feb. 19, 1968 2 Sheets-Sheet 1

INVENTORS.
GEORGE B. MANN and
RICHARD C. TONNER

BY David M. Keay
AGENT.

INVENTORS.
GEORGE B. MANN and
RICHARD C. TONNER

BY David M. Kay

AGENT.

United States Patent Office 3,473,124
Patented Oct. 14, 1969

3,473,124

METHOD OF ELECTRICALLY TESTING SEMICONDUCTOR ELEMENTS RETAINED UNDER A PRESSURE DRAWN FILM

George B. Mann, Tewksbury, and Richard C. Tonner, Braintree, Mass., assignors to Sylvania Electric Products Inc., a corporation of Delaware Filed Feb. 19, 1968, Ser. No. 706,503
Int. Cl. G01r 3/00, 15/00
U.S. Cl. 324—158 7 Claims

ABSTRACT OF THE DISCLOSURE

Method of holding a perforate array of beam-leaded semiconductor devices in fixed position by placing the array on a porous support plate of insulating material, placing a thin plastic film over the array, and reducing the pressure at the undersuface of the porous support plate. While the plastic film is drawn against the array holding the array firmly to the support plate, a set of conductive probes penetrates the film to contact each device in succession so that electrical tests can be performed.

Background of the invention

This invention relates to semiconductor electrical translating devices. More particularly, it is concerned with methods of electrically testing a plurality of semiconductor elements arranged in an array.

Present techniques of diffusing conductivity type imparting materials through small, precisely defined openings in protective coatings (typically silicon oxide) on bodies of semiconductor material (typically silicon) have made possible the fabrication of semiconductor devices such as diodes, transistors, and integrated circuit networks of exceptionally small size. By employing these processing techniques, the electrically active zones of a large number of devices are fabricated simultaneously in a single wafer of semiconductor material. Contact members making ohmic electrical connection to each of the active zones are then formed on the wafer.

After the formation of the electrically active zones and contact members, the electrically active zones of each device are electrically tested and the defective devices identified. Then the wafer is divided into individual dice, each containing the electrically active zones of a semiconductor device. Only those dice containing devices which passed the electrical tests are processed further, each such die being bonded in place on a suitable mounting header with appropriate electrical connections provided between the contact members and conductive members of the header. Thus, individual processing of defective dice is prevented.

During electrical testing of the devices, the wafer is held in fixed position in a vacuum holder which includes an insulating support member having apertures therethrough. The wafer covers the apertures at the upper surface of the support member and at the lower surface the apertures open into a chamber which is partially evacuated so that the difference in pressure holds the wafer against the upper surface of the support member. The wafer is then aligned with a set of test probes which are arranged in a pattern conforming to the pattern of the contact members of a device. The test probes are automatically brought into contact with the contact members of each device in succession and an electrical test is conducted on each device by testing circuitry connected to the probes. A suitable recording is made of the test results as each device is tested. In one method of recording a drop of ink is immediately placed on a defective device. After the testing has been completed and the wafer divided into dice, the defective dice can be detected by observation and manually separated from the electrically satisfactory dice.

In application Ser. No. 539,444, filed Apr. 1, 1966, now Patent No. 3,387,359 by Brian Dale and Robert C. Ingraham entitled "Method of Producing Semiconductor Devices" and assigned to the assignee of the present invention, there is described a method of handling semiconductor elements which are supported in a network of supporting members of the so-called beam-lead construction by beams fixed to each individual semiconductor die and to the supporting network. This array of semiconductor elements is fabricated from a wafer of semiconductor material by forming the supporting beam-lead structure and beam-lead contact members on the wafer after electrically active zones have been formed by diffusion. Then the silicon material of the wafer is removed except for discrete portions (dice) containing the active zones of the semiconductor elements to provide a perforate array of semiconductor elements.

At this stage the semiconductor elements of the array are in condition to be electrically tested and the defective elements identified. However, the array is permeated by a multiplicity of very small openings, the dice are very small, and the apertures in the support member of vacuum holders of the type described above are relatively large. Therefore, sufficient pressure differential cannot be obtained to hold the array satisfactorily in a vacuum holder of the type described above while electrical tests are conducted on the devices of the array.

Summary of the invention

The present invention provides a method of electrically testing semiconductor elements which are disposed in a perforate array and, therefor, not amenable to being supported by a vacuum holder of the type described above. In accordance with the method of the invention, the array of semiconductor elements is placed on a non-conductive surface of a porous support member. A thin, continuous, imperforate film of insulating material is placed on the array. The pressure at the surface of the porous support member opposite the surface in contact with the array is reduced to cause the film to hold the array against the surface of the porous support member. The tips of conductive probes are inserted through the film into electrical contact with a semiconductor element of the array and electrical signals are applied to the probes in order to conduct an electrical test on the element while the array is being held against the surface of the porous support member.

After the electrical test is conducted, the tips of the probes are withdrawn from the film and re-inserted through the film into electrical contact with another semiconductor element of the array. Electrical signals are again applied to the probe to conduct an electrical test of that element. These steps are repeated until all of the semiconductor elements of the array have been subjected to an electrical test.

Brief description of the drawings

Various objects, features, and advantages of the method of the invention will be apparent from the following detailed discussion and the accompanying drawings wherein.

Detailed description of the invention

Figures 1, 2, 3:
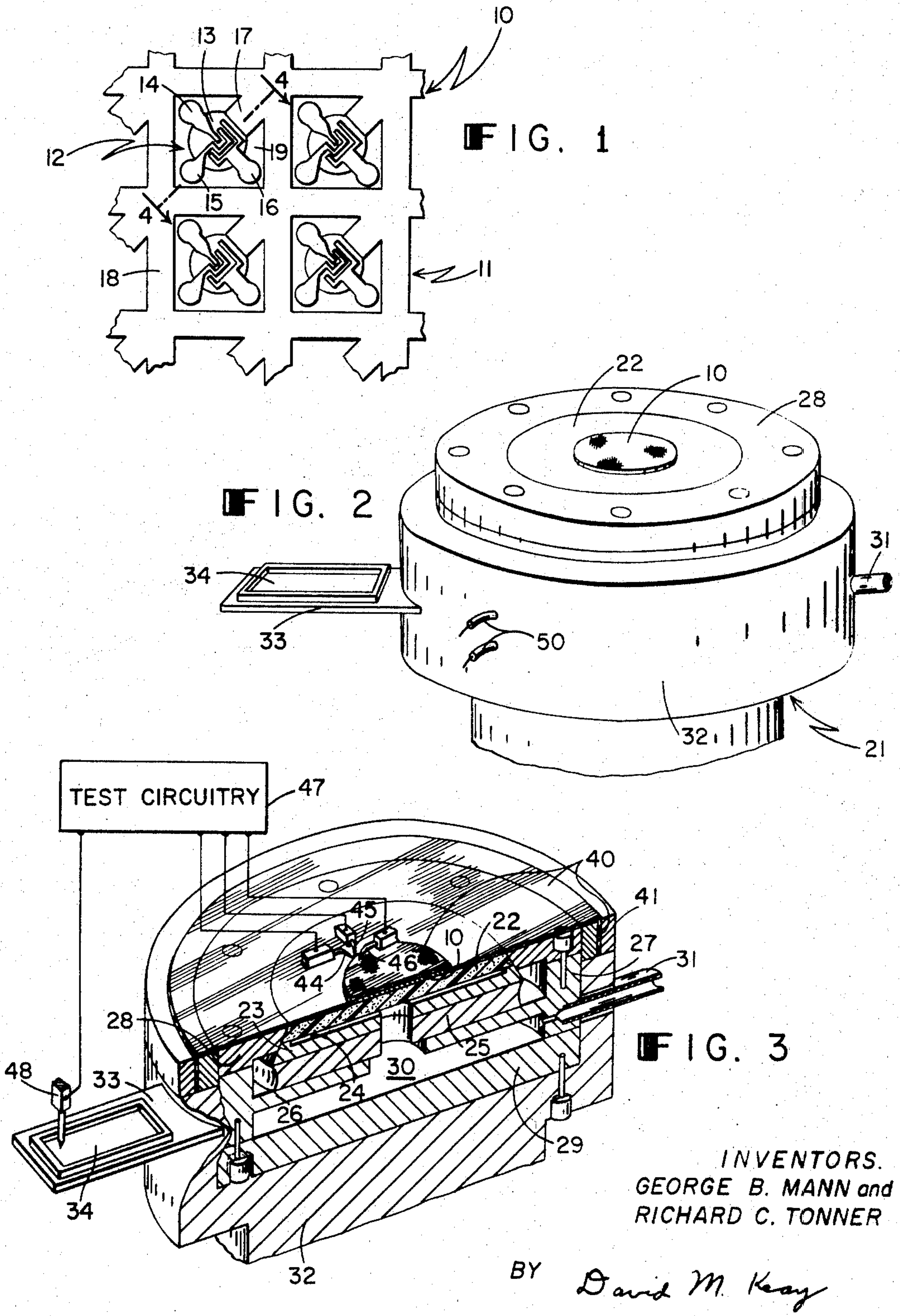
FIG. 1 is a plan view of a fragment of an array of semiconductor elements comprising a plurality of semiconductor dice held in fixed relationship by a supporting grid structure of beam-lead members.
FIG. 2 is a representation in perspective of apparatus employed in supporting an array of semiconductor elements during electrical testing according to the method of the invention showing an array of semiconductor elements positioned on the apparatus.
FIG. 3 is a perspective view in cross-section of the apparatus of FIG. 2 illustrating the film of insulating material and the conductive probes employed in carrying out the method of the invention.

A fragment of an array of semiconductor elements 10 to be electrically tested in accordance with the method of the invention is illustrated in FIG. 1. The array is formed from a wafer of semiconductor material, for example, silicon. Conductivity type imparting materials are diffused into the wafer through openings in silicon oxide coatings on the surface of the wafer to form zones of opposite conductivity types. Each group of zones is the electrically active zones of a semiconductor device, and the groups are evenly distributed in a regular pattern over the surface of the wafer. For illustrative purposes, each group of zones is shown as the electrically active zones of a transistor.

A network of conductive supporting beam leads 11 is formed on the surface of the oxide coated silicon wafer in the pattern illustrated in FIG. 1. The adherent supporting beam network is produced on the wafer as by the method of forming connecting leads described and claimed in copending application Ser. No. 658,427, filed Aug. 4, 1967, by Nino P. Cerniglia and Richard C. Tonner entitled "Method of Forming Leads on Semiconductor Devices" and assigned to the assignee of the present invention.

Upon completion of the beam-lead network, the silicon material of the wafer is removed except for discrete portions containing the active zones of semiconductor elements. This procedure may be accomplished by mounting the wafer with the beam-leaded surface against a suitable supporting block. Then the thickness of the entire wafer is reduced by lapping the exposed undersurface of the wafer or by immersing the assembly in a suitable etching solution which dissolves silicon. After the wafer has been reduced to the desired thickness, the undersurface of the wafer is masked with a suitable protective material to protect the electrically active zones of each semiconductor element, and the assembly is immersed in a suitable etching solution to dissolve all the unprotected silicon.

Each semiconductor element 12 of the resulting array as shown in FIG. 1 includes a die 13 of silicon having a group of three active zones enabling the element to function as a transistor. Conductive beam leads 14, 15, and 16 which adhere to the surface of each die and project from the die make contact through openings in the oxide coating to underlying active zones thereby providing contact members to the emitter, base, and collector zones, respectively.

A fourth beam lead 17 also adheres to the surface of each die but is not electrically connected to the semiconductor material underlying the oxide coating. The fourth beam leads 17 extend to a supporting grid 18 which is also part of the beam-lead network 11 thereby supporting each semiconductor element in position with respect to the supporting grid and the other semiconductor elements of the array. The supporting grid 18 is composed of two sets of parallel beams intersecting at right angles. A semiconductor die is located centrally of each square space formed by the intersecting sets of beams, producing a regular two-dimensional array of substantially identical semiconductor elements arranged in a square pattern of even rows and columns. The array is perforated with openings 19 in the portions of the spaces within the intersecting sets of parallel beams of the supporting grid not occupied by the beam leads 14, 15, 16 and 17 or the semiconductor dice 13.

The array of semiconductor elements 10 is placed on a movable support 21 as illustrated in FIG. 2. Details of the support are shown in the cross-sectional view of FIG. 3. The support includes a porous supporting member or plate 22 of insulating material. The plate may, for example, be of tetrafluoroethylene particles compacted into a firm mass having interstitial openings of the order of 30 to 40 microns. The support plate 22 is mounted on a conductive plate 23, which may be of aluminum, having a central opening and a plurality of radially extending channels 24 at the surface adjacent the supporting plate. A thermo-electric cooling block 25 of the type which employs the Peltier effect to reduce temperature is associated with the conductive plate 23 so as to cool the plate when electrical current is supplied to the thermo-electric block.

The porous support plate 22, the conductive plate 23 and the thermo-electric block 25 are clamped against an inwardly extending flange 26 of a body member 27 by a retaining ring 28. A plate 29 is attached to the bottom of the body member 27 providing a sealed chamber 30 which communicates with the undersurface of the porous support plate 22 by means of the central openings in the body flange 26 and the thermo-electric block 25 and the central opening and radial channels in the conductive plate 23. The pressure within the chamber 30 can be reduced by a vacuum pump (not shown) atttached to an exhaust tubulation 31. The foregoing assembled elements are positioned in a frame 32 which may be mounted on suitable apparatus (not shown) for imparting rotational, vertical, and horizontal linear movement to the frame. A platform 33 attached to the frame 32 supports a card 34, the use of which will be explained hereinbelow.

After the array 10 is placed on the porous support plate 22 with the beam-leaded surface against the plate as illustrated in FIG. 2, a thin, continuous, imperforate sheet 40 of plastic is placed over the array. As illustrated in FIG. 3 the plastic sheet 40 may be held in an "embroidery-hoop" type of retaining ring 41 which rests on the upper surface of the frame 32. Then the chamber 30 is partially evacuated to reduce the pressure at the undersurface of the porous support plate 22. The plastic film is drawn toward the support plate 22 by the pressure differential and holds the array of semiconductor elements against the upper surface of the support plate.

The movable support 21 is positioned beneath a set of conductive probes 44, 45, and 46 (three for the transistor illustrated) arranged in the pattern of the three beam-lead contact members 14, 15, and 16 of each semiconductor element. The probes are electrically connected to electrical test circuitry 47, as indicated schematically in FIG. 3. A punch 48 associated with the test circuitry and fixed horizontally with respect to the probes is located over the card 34.

The movable support 21 is maneuvered manually to orient the array with respect to the probes 44, 45, and 46 so that the probe tips are aligned with the beam-lead contact members of a semiconductor element. Then the movable support 21 is moved vertically (usually automatically) to cause the tips of the probes to penetrate the plastic film and make electrical contact to the beam-lead contact members of the semiconductor element, as illustrated in the enlarged cross-sectional view of FIG. 4. With the tips of the probes in contact with the contact members 14, 15, and 16 of the semiconductor element, an electrical test is conducted by electrical signals from the test circuitry 47 connected to the probes. An indication of the results of the electrical tests performed is recorded by actuation of the punch 48 by the test circuitry 47 to punch a hole in the card 34 when the element tested is found to be defective.

After the electrical test is conducted, the movable support is lowered to withdraw the probes from the plastic film, the movable support is indexed horizontally to position another semiconductor element in alignment with the probes, the movable support is raised to cause the tips of the probes to penetrate the plastic film and make electrical contact with the beam-lead contact members of that semiconductor element, and an electrical test is conducted. This procedure is caused to be repeated automatically by suitable apparatus (not shown) until all semiconductor elements in the array have been tested. A suitable recording of the test results is provided by the card 34 which is punched in a pattern conforming to the pattern of defective semiconductor elements in the array.

Figure 4:
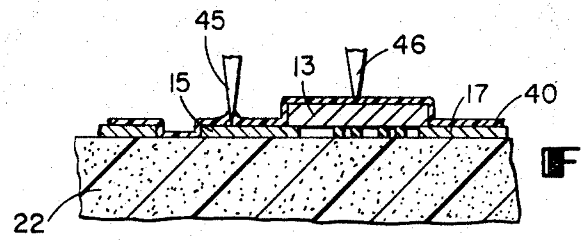
FIG. 4 is an enlarged cross-sectional view showing the conductive probes in contact with the contact members of a semiconductor element for conducting an electrical test thereon.

During the entire procedure, the array 10 is held firmly in position against the upper surface of the porous support plate 22 by the plastic film 40. As illustrated in FIG. 4, the film tends to conform to the contours of the exposed surface of the array and support plate. The holes remaining in the plastic film after the probes are withdrawn do not significantly affect the amount of vacuum at the undersurface of the support plate 22 which causes the film to be urged downward. Apparently the film is in contact with the surface of the contact members in such a manner as to maintain a satisfactory seal between them in all regions encircling the holes. It may also be that material displaced by the entering probes at least partially refills the holes upon withdrawal of the probes.

It has been found that polyethylene film about ½-mil thick is satisfactory as a plastic material when used with test probes having tips with a 5° taper terminating in a 1⁄10-mil radius tip. The polyethylene film is very flexible and readily conforms to the exposed surfaces against which it is urged by a pressure differential. It also has excellent insulating characteristics and does not tend to collect moisture or other contaminating materials which would affect the electrical tests. The porous support plate 22 of tetrafluoroethylene also has very good insulating characteristics and does not affect the electrical tests.

Figure 5:
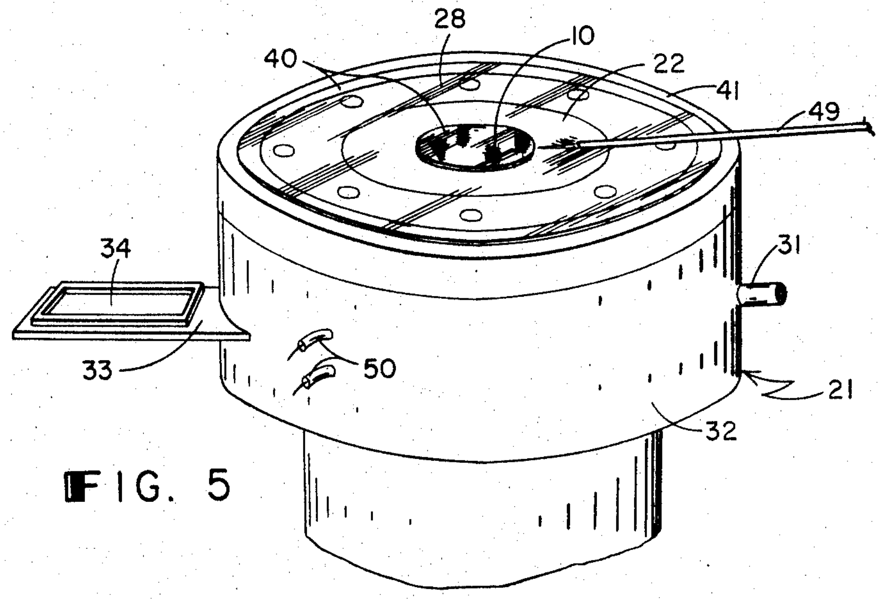
FIG. 5 is a perspective view of the apparatus of FIGS. 2 and 3 illustrating the manner of fixing the array to the support member by freezing subsequent to electrical testing of the semiconductor elements.

After all the semiconductor elements of the array have been tested, the array may be removed from the apparatus for further processing by restoring atmospheric pressure within the chamber, lifting off the retaining ring 41 and plastic film 40, and then picking up the array. If desired the array may be held fixed in position on the supporting plate while individual semiconductor elements are removed from the array and mounted on headers. More specifically, as illustrated in FIG. 5 while the array is being held against the support plate by the plastic film, a fluid, water is injected between the plastic film 40 and the support plate 22 into the interstices of the array by means of a tube 49. Then, electrical current is passed through the thermoelectric cooling block 25 by lead wires 50 freezing the water and thus fixing the array to the support plate 22. The reduced pressure within the chamber 30 is restored to normal atmospheric pressure and the plastic film 40 is removed. The characteristics of the polyethylene film are such that the film does not adhere tenaciously to the ice and it is readily removed.

The array 10, held frozen to the support plate 22, may then be processed in accordance with the teachings in application Serial No. 661,995, filed August 21, 1967, by Nino P. Cerniglia and Richard C. Tonner entitled "Method of Producing Semiconductor Devices" and assigned to the assignee of the present invention, in order to separate semiconductor elements one at a time from the support plate and mount them on suitable headers. The card 34 on which the test results were recorded may be employed to control the apparatus effecting the removal and transfer of the individual elements so that only those elements which are indicated as satisfactory are removed from the array and mounted on headers.

What is claimed is:

1. The method of electrically testing semiconductor elements disposed in a perforate array including the steps of placing the array of semiconductor elements on a non-conductive surface of a porous support member;

forming a chamber by placing a thin, continuous, imperforate film of insulating material on the array to thereby encompass said array within said chamber;

reducing the pressure at the surface of the porous support member opposite the first-mentioned surface to cause the film to hold the array against the first-mentioned surface of the porous support member; and inserting the tips of conductive probes through said film into electrical contact with a semiconductor element of the array, and applying electrical signals to said probes to conduct an electrical test on said element while the array is held against the first-mentioned surface of the porous support member.

2. The method of electrically testing semiconductor elements in accordance with claim 1 and further including, while the array is held against the first-mentioned surface of the porous support member, the steps of withdrawing the tips of the probes from said film;

inserting the tips of the probes through said film into electrical contact with another semiconductor element of the array; and applying electrical signals to said probes to conduct an electrical test on the element.

3. The method of electrically testing semiconductor elements in accordance with claim 2 and further including, while the array is held against the first-mentioned surface of the porous support member, continuing the steps of withdrawing the tips of the probes from said film;

inserting the tips of the probes through said film into electrical contact with a different one of the semiconductor elements of the array; and applying electrical signals to said probes to conduct an electrical test on the element;

whereby all the semiconductor elements of the array are subjected to an electrical test.

4. The method of electrically testing semiconductor elements disposed in a two-dimensional array comprising a plurality of substantially identical semiconductor elements, each semiconductor element including a body of semiconductor material having the electrically active zones of a semiconductor device fabricated therein and a plurality of conductive contact members electrically connected to the electrically active zones and projecting from the body, a supporting grid, supporting members fixed to each body of semiconductor material and to the supporting grid to support the semiconductor elements and position them in a regular two-dimensional pattern, said method including the steps of placing the array of semiconductor elements on a first flat surface of a porous support member of insulating material;

forming a chamber by placing a continuous, imperforate film of polyethylene of the order of ½-mil thick on the array to thereby encompass said array within said chamber;

reducing the ambient pressure at the surface of the porous support member opposite said first surface to cause the polyethylene film to be drawn toward the first surface and hold the array against the first surface inserting the tips of conductive probes having a radius of curvature of the order of 1⁄10-mil through the polyethylene film and into electrical contact with the conductive contact members of a semiconductor element and applying electrical signals to said probes to conduct an electrical test of the electrically active zones of the element while the array is held against the first surface of the porous support member.

5. The method of electrically testing semiconductor elements in accordance with claim 4 and further including, while the array is held against the first surface of the support member, the steps of withdrawing the tips of the probes from the polyethylene film;

moving the probes with respect to the array a predetermined distance to position the probes adjacent another semiconductor element of the array;

inserting the tips of the probes through the polyethylene film into electrical contact with the conductive contact members of the semiconductor element; and applying electrical sginals to said probes to conduct an electrical test on the electrically active zones of the element.

6. The method of electrically testing semi-conductor elements in accordance with claim 4 and further including, while the array is held against the first surface of the support member, continuing the steps of withdrawing the tips of the probes from the polyethylene film;

moving the probes with respect to the array a predetermined distance to position the probes adjacent a different semiconductor element of the array;

inserting the tips of the probes through the polyethylene film into electrical contact with the conductive contact members of the semiconductor element;

applying electrical signals to said probes to conduct an electrical test on the electrically active zones of the element; and further including the step of recording an indication of the results of each electrical test in a manner associating the recorded indication with the semiconductor element tested; whereby all of the semiconductor elements of the array are subjected to an electrical test and indications of the test results are recorded.

7. The method of electrically testing semiconductor elements in accordance with claim 6 and further including the steps of withdrawing the tips of the probes from the polyethylene film subsequent to conducting an electrical test on the last element of the array;

injecting a fluid medium between the polyethylene film and said first surface of the support member into the interstices of the array and freezing the fluid medium whereby the semiconductor elements of the array are held in fixed position with respect to said support member by the frozen fluid medium;

increasing the ambient pressure at the surface of the porous support member opposite said first surface to the pressure at the first surface; and removing the polyethylene film from the array.

References Cited

UNITED STATES PATENTS 3,405,361 10/1968 Kattner ------------ 324—158

RUDOLPH V. ROLINEC, Primary Examiner

E. L. SOLARUN, Assistant Examiner